US011613908B2

(12) United States Patent
Tower et al.

(10) Patent No.: US 11,613,908 B2
(45) Date of Patent: Mar. 28, 2023

(54) LATCH FOR A COMPUTING SYSTEM

(71) Applicant: Hewlett Packard Enterprise Development LP, Houston, TX (US)

(72) Inventors: Daniel W. Tower, Houston, TX (US);
Earl W. Moore, Cypress, TX (US);
Kenny Huy Pham, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 352 days.

(21) Appl. No.: 16/804,114

(22) Filed: Feb. 28, 2020

(65) Prior Publication Data
US 2021/0270056 A1    Sep. 2, 2021

(51) Int. Cl.
*E05B 9/02*         (2006.01)
*H05K 5/02*        (2006.01)
*H05K 7/14*        (2006.01)

(52) U.S. Cl.
CPC .............. *E05B 9/02* (2013.01); *H05K 5/0221* (2013.01); *H05K 7/1488* (2013.01)

(58) Field of Classification Search
CPC ..... E05B 9/00; E05B 9/02; E05B 9/08; E05B 83/00; E05B 83/24; E05B 83/243; E05B 83/247; H05K 5/00; H05K 5/02; H05K 5/0204; H05K 5/0208; H05K 5/0217; H05K 5/0221; H05K 5/0226; H05K 5/023; H05K 7/00; H05K 7/14; H05K 7/1485; H05K 7/1488; H05K 7/1489
USPC ........................................................ 292/66
See application file for complete search history.

(56) References Cited

U.S. PATENT DOCUMENTS

| | | | | |
|---|---|---|---|---|
| 6,123,203 A | * | 9/2000 | Gibbons | H05K 7/1489 |
| | | | | 211/26 |
| 9,078,349 B1 | * | 7/2015 | Lewis | H05K 5/0204 |
| 9,157,261 B2 | * | 10/2015 | Rahilly | E05B 47/0012 |
| 9,253,914 B2 | * | 2/2016 | Demange | H05K 7/1409 |
| 9,777,514 B2 | * | 10/2017 | Haidvogl | E05B 17/005 |
| 10,051,758 B2 | * | 8/2018 | Hofmann | H05K 7/1489 |
| 2011/0279973 A1 | * | 11/2011 | Terwilliger | H05K 7/1489 |
| | | | | 312/223.2 |

(Continued)

OTHER PUBLICATIONS

Tech Library, "Extend the Server from the Rack", available online at <https://techlibrary.hpe.com/docs/iss/DL80_Gen9/setup_install/217434.htm>, Retrieved on Jun. 20, 2019, 3 pages.

(Continued)

*Primary Examiner* — Nathan Cumar
(74) *Attorney, Agent, or Firm* — Hewlett Packard Enterprise Patent Department

(57) ABSTRACT

Example implementations relate to a latch and a computing system including such latch. The latch may include a latch enclosure and a latch assembly housed at least partially within the latch enclosure. The latch assembly may include a lever mounted to the latch enclosure via a first pivot pin and having a handle section disposed outside the latch enclosure and a force transfer section integrated with the handle section and disposed inside the latch enclosure. Further, the latch may include a hook engaged with the lever and mounted at least partially within the latch enclosure via a second pivot pin, wherein a movement of the lever about the first pivot pin causes a movement of the hook about the second pivot pin via the force transfer section.

20 Claims, 4 Drawing Sheets

(56) References Cited

U.S. PATENT DOCUMENTS

2012/0146469 A1\* 6/2012 Zhang .................... G06F 1/181
312/223.2
2012/0188710 A1\* 7/2012 Phelan ................. F16B 21/088
403/322.4

OTHER PUBLICATIONS

Hewlett Packard Enterprise, "Extend the Server From the Rack," retrieved online on Jun. 20, 2019, 3 Pgs.

\* cited by examiner

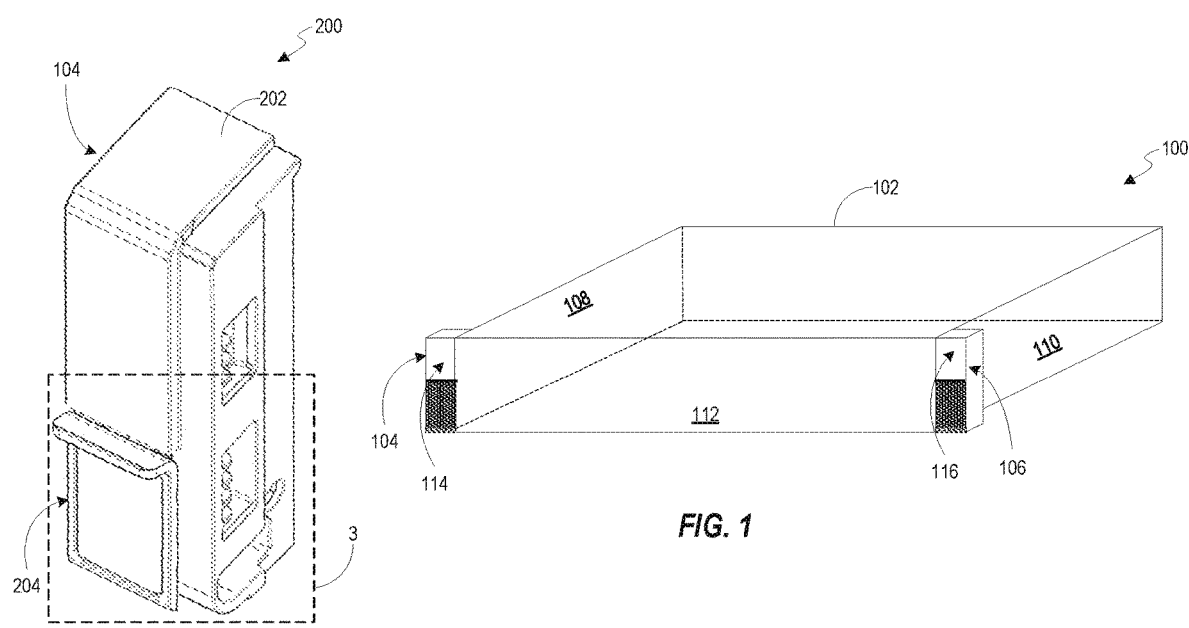

LATCH FOR A COMPUTING SYSTEM

BACKGROUND

Typically, in a computing environment, for example, a datacenter, various computing systems may be disposed. In the computing environment; the computing systems may be mounted on one or more racks. To facilitate a secure mounting of the computing systems, the computing systems may include one or more latches. The latches may mechanically couple the computing systems with rails mounted on the rack, for example.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein:

FIG. 1 is a perspective view of a computing system having at least one latch, in accordance with one example;

FIG. 2 is a perspective view of a latch, in accordance with one example;

Figures 3, 4, 5:
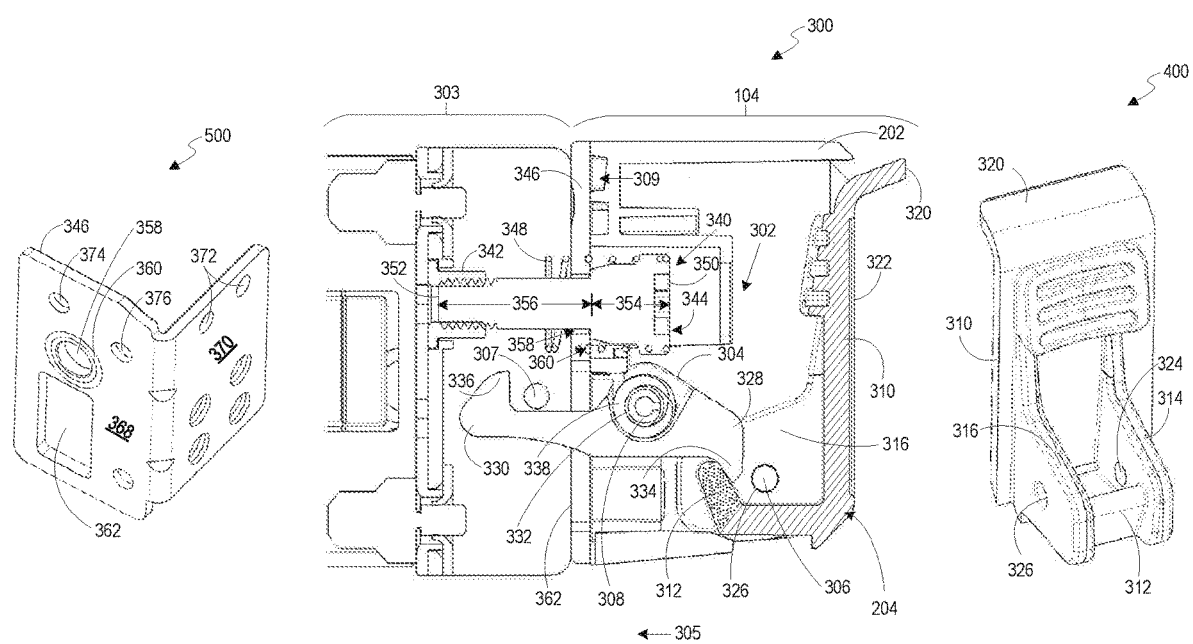
FIG. 3 is a cross-sectional view of a portion of a latch, in accordance with one example.
FIG. 4 is a perspective view of a lever of a latch assembly, in accordance with one example.
FIG. 5 is a perspective view of a bracket of a latch assembly, in accordance with one example.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements can be coupled mechanically, electrically, or communicatively linked. The term "and/or" as used herein refers to and encompasses any and all possible combinations of the associated listed items. It will also be understood that, although the terms first, second, etc., may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to.

Computing systems may be mounted on one or more racks. To facilitate a secure mounting of the computing systems, the computing systems may typically include one or more latches. By way of example, to facilitate mounting of a computing system on a rack, the computing system may include a pair of latches disposed on side walls. The latches may mechanically couple the computing system on the rack, for example. For added support, the rack may include sliding rails to stabilize the computing system during insertion and removal.

A latch may typically include various components such as a lever and a hook. Traditionally, the components such as the lever and the hook are made of metals. Use of the metal components generally increases overall weight of the latch and the computing system. Also, the lever used in traditional latches includes several discrete metal parts assembled together. For example, a traditional lever used in a latch, may include a metal pin (e.g., spring pin) to aid in pivot mounting of the lever as well as effecting the movement of the hook. Consequently, to allow use of such pins, the lever may have corresponding mounting provisions (e.g., openings) to receive such pins. Overall, use of the metal and increased number or discrete metal parts may lead to complexity of design of the latch and may increase overall cost of the computing system having such latches.

In accordance with aspects of the present disclosure, an example latch and a computing system including such latch are presented. The latch may include a latch enclosure and a latch assembly housed at least partially within the latch enclosure. The latch assembly may include a lever mounted to the latch enclosure via a first pivot pin and having a handle section disposed outside the latch enclosure and a force transfer section integrated with the handle section and disposed inside the latch enclosure. Further, the latch may include a hook engaged with the lever and mounted at least partially within the latch enclosure via a second pivot pin, wherein a movement of the lever about the first pivot pin causes a movement of the hook about the second pivot pin via the force transfer section.

Referring now to drawings, FIG. 1 depicts a perspective view 100 of a computing system 101 having at least one latch, in accordance with one example. By way of example, the computing system 101 may represent a computing device such as, but not limited to, a computer, a server, a storage device, an Internet-of-Things (IoT) compute device, a network switch, a wireless communication device/an access point, a wireless range extender, a repeater, a protocol converter, a firewall device, a network gateway, a network address translator, a multiplexer, a network interface controller, a wireless network interface controller, an ISDN terminal adapter, etc. It may be noted that aspects of the present disclosure are not limited with respect to a types or the various examples of the computing system 101 listed hereinabove. In accordance with aspects of the present disclosure, the computing system 101 may include a system enclosure 102 and at least one latch, such as, latches 104 and 106.

The system enclosure 102 may house one or more electronic components (not shown) to facilitate functionalities intended to be performed by the computing system 101.

Examples of the electronic components may include, but are not limited to, one or more of processing resources, electronic storage devices, power supply and power management modules, remote management modules, communication modules (wired and/or wireless), input-output units (e.g., communication ports), display, heatsink, etc. In some examples, the system enclosure 102 may include one or more openings, windows, and/or slots to facilitate installation and/or removal of the electronic components. Further, in the example of FIG. 1, although the system enclosure 102 is shown to have a rectangular box shape, the present disclosure is not limited with respect to a shape of the system enclosure 102. The system enclosure 102 may have a plurality side walls, such as, side walls 108, 110. In the example of FIG. 1, where the system enclosure 102 is shown to have a rectangular box shape, the system enclosure 102 has six side walls, of which the three side walls have been labeled as 108, 110, and 112, for illustration purposes.

In some examples, the computing system 101 may be disposed on a receiving structure (see FIG. 3). The receiving structure may be a rack or a rail, for example. By way of example, the rack may be any structure which can hold various hardware modules such as the computing system 101 thereon. The rail may be a guiding structure that can hold various hardware modules such as the computing system 101 thereon. The rail may allow the hardware modules to slide thereon and for a secure placement. In one implementation, the computing system 101 may be disposed directly on the rack. One or more than one computing systems may be mounted on the rack. In certain other example implementations, the computing system 101 may be mounted on one or more rails (see FIGS. 3, 6, 7). The rails may be mounted on the rack. In some examples, the latches 104, 106 may facilitate secure mounting of the computing system 101 on the rack or the rails mounted on the rail.

In some examples, the latches 104, 106 may be disposed on the system enclosure 102, more particularly, on at least one side wall of the plurality of side walls. For example, as shown in FIG. 1, the latches 104 and 106 are disposed on the side walls 108 and 110, respectively. The latches 104 and 106 are respectively mounted/attached to the side walls 108 and 110 via one or more of adhesives, clamps, fasteners (e.g., screws), and the like, without limiting the scope of the present application. Further, the latches 104 and 106 may be mounted on the system enclosure 102 such that front faces 114, 116 of the latches 104 and 106, respectively, are aligned with the side wall 112. In accordance with the aspects of the present disclosure, the latches 104 and 106 may be disposed at any location on the side walls 108 and 110, respectively, for example. Moreover, although, two latches 104, 106 are shown in FIG. 1, the computing system 101 of FIG. 1 is also envisioned to include a single latch or more than two latches similar to any of the latches 104 and 106.

In the description hereinafter, various features of the latch 104 will be described in detail. Any other latch (e.g., the latch 106) mounted on the system enclosure 102 may also include features similar to those of the latch 104. In accordance with aspects of the present disclosure, FIG. 2 represents a perspective view 200 of the example latch 104. In the perspective view 200 of FIG. 2, various components, such as, a latch enclosure 202 and a lever 204 can be seen. Although not shown in FIG. 2, the latch 104 may include a bracket (see FIG. 5) which may aid in coupling the latch 104 with the system enclosure 102, for example, at the side wall 108. The bracket may be coupled to the system enclosure 102 (see FIG. 1) of the computing system 101 via one or more of adhesives, fasteners (e.g., screws), and the like, without limiting the scope of the present application.

The latch enclosure 202 may serve as a housing for a latch assembly (described later) including the lever 204. In some examples, the latch enclosure 202 may be monolithic structure. In some other examples, the latch enclosure 202 may be formed by assembling a plurality of pieces. Further, the latch enclosure 202 and the lever 204 may be formed using a material, for example, plastic. Use of the plastic based latch enclosure 202 and the lever 204 may greatly reduce the overall weight and cost of the latch 104 and the computing system 101 using the latch 104. In some other examples, other light-weight materials including, but not limited to, Polycarbonate Acrylonitrile Butadiene Styrene (PC ABS), may also be used to form the latch enclosure 202 and the lever 204. Additional details of the latch 104 will be described in conjunction with FIGS. 3-7.

Figure 6:
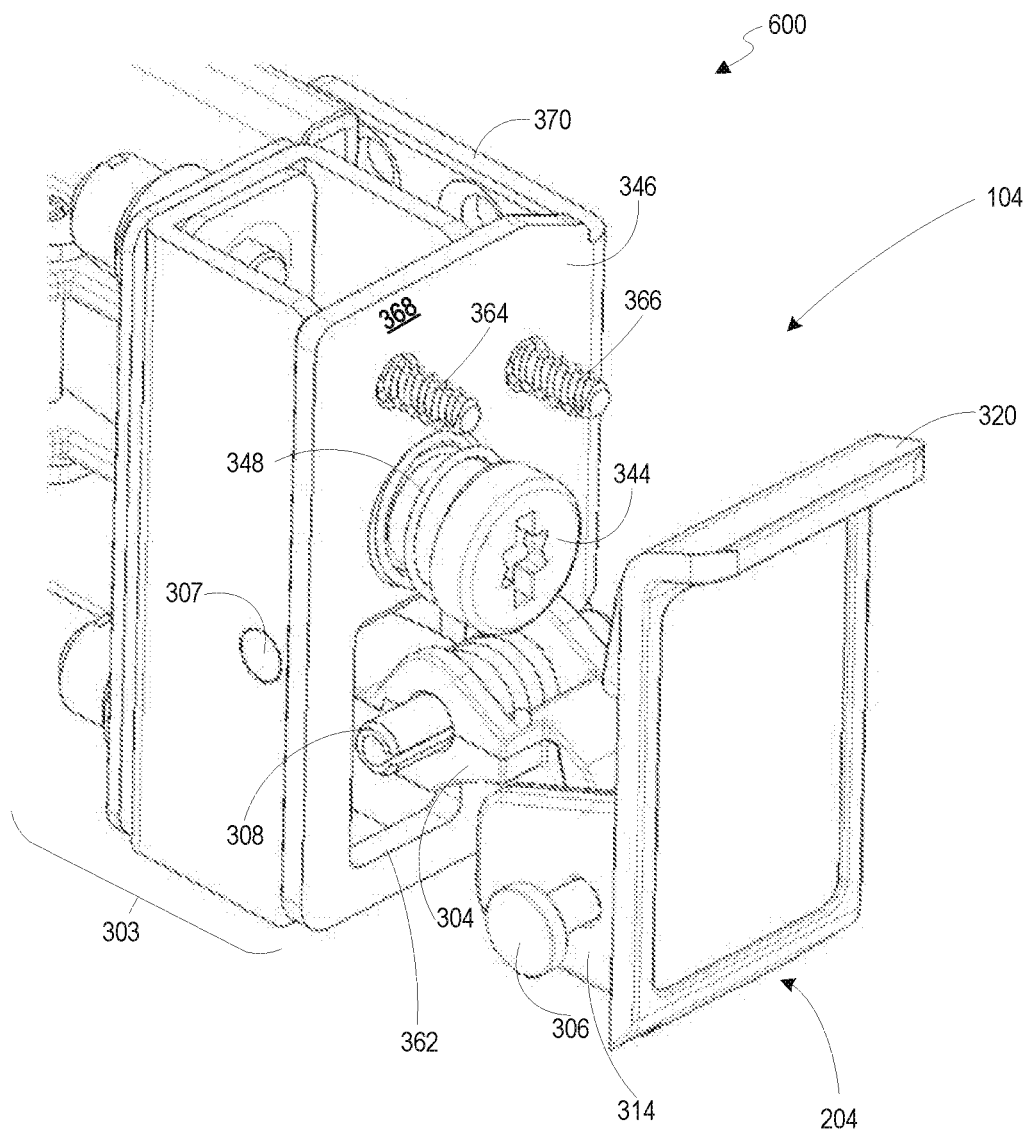
FIG. 6 is a perspective view of a latch showing mounting of a lever, in accordance with one example.

For ease of illustration, FIGS. 3-6 will be described concurrently. In particular, FIG. 3 depicts a cross-sectional view 300 of a portion 3 (see FIG. 2) of the latch 104, in accordance with one example. Further, FIG. 4 shows a perspective view 400 of a lever, such as, the lever 204, in accordance with one example. Furthermore, FIG. 5 depicts a perspective view 500 of a bracket, in accordance with one example. Further, FIG. 6 depicts a perspective view 600 of the latch 104 showing mounting of the lever 204, in accordance with one example. Also, to aid in clarity, in FIGS. 3-6, like components have been labeled with same reference numerals.

In the cross-sectional view 300 of FIG. 3, the latch 104 can be seen in engagement with a receiving structure 303. The receiving structure 303 may be any of a rail or a rack. In the example of FIG. 3, the latch 104 is shown coupled to the receiving structure 303, such as, a rail. The receiving structure 303 (e.g., the rail) may be mounted on a rack, in some examples. The latch 104 may include a latch assembly 302. In some examples, the latch assembly 302 may include the lever 204, a hook 304, a first pivot pin 306, and a second pivot pin 308. In some examples, the latch assembly 302 may be housed at least partially within (described later) the latch enclosure 202, as depicted in FIGS. 3 and 6.

As previously noted, the lever 204 may be formed using plastic. Use of the plastic based lever 204 may greatly reduce the overall weight and cost of the latch 104. Further, as depicted in FIGS. 3 and 4, the lever 204 may include a handle section 310, a force transfer section 312, and one or more side wall sections 314, 316. The side wall sections 314, 316 may be disposed between the handle section 310 and the force transfer section 312 (see FIG. 4). For ease of illustration, the handle section 310 and the force transfer section 312 are marked with different patterns. For example, the handle section 310 is marked with angles lines while the force transfer section 312 is marked with a dotted pattern. Accordingly, in some examples, the handle section 310 may have an L-shaped design. Also, in some examples, the force transfer section 312 may be a rectangular piece of material (with or without curved edges).

The force transfer section 312 may be integrated with the handle section 310 leading to a single piece L-shaped structure of the lever having a protrusion caused by the force transfer section 312, as depicted in FIG. 3. In some examples, the handle section 310 and the force transfer section 312 may form a monolithic structure resulting in the single piece L-shaped structure of the lever. In some examples, the force transfer section 312 may be integrated with the handle section 310 by way of attachment to the handle section 310. The force transfer section 312 may be attached to the handle section 310 via an adhesive, for example. Further, the side wall sections 314, 316 may be disposed at each side of the force transfer section 312, as depicted in FIG. 4. In some examples, the handle section 310, the force transfer section 312, and the side wall sections 314, 316 may form a monolithic structure. In some other examples, each of the handle section 310, the force transfer section 312, and the side wall sections 314, 316 may be a single piece unit and attached to each other to form the lever 204. In certain other examples, the side wall sections 314, 316 may be attached to the single piece L-shaped structure having the handle section 310 and the force transfer section 312.

The handle section 310, the force transfer section 312, and the side wall sections 314, 316 may be made of plastic or any other light-weight material. For example, having a plastic based force transfer section 312 in the lever 204 in comparison to a metal pin (e.g., spring pin) used in the levers of traditional latches may reduce both cost and weight of the latch 104. Further, since the side wall sections 314, 316 may also be made of plastic, in some examples, use of the plastic based force transfer section 312 may impart reduced load on the side wall sections 314, 316 in comparison to the spring pin. Furthermore, in accordance with aspects of the present disclosure, the side wall sections 314, 316 may be dimensioned to have thickness which can withstand a force exerted on the force transfer section 312, thereby enhancing a reliable operation of the lever 204 and the latch 104.

Additionally, in some examples, the handle section 310 may include a force application section 320 protruding away from the latch enclosure 202. The force application section 320 may aid in operating the lever 204 by applying a downward force on the force application section 320, The downward force on the force application section 320 may cause the lever 204 to pivot around the first pivot pin 306.

The lever 204 may be mounted to the latch enclosure 202 via the first pivot pin 306 such that the handle section 310 is disposed at least partially outside the latch enclosure 202 and the force transfer section 312 is disposed inside the latch enclosure 202. In particular, the force application section 320 and a face 322 of the handle section 310 may remain outside of the latch enclosure 202. In some examples, to allow the mounting of the lever 204, the side wall sections 314 and 316 may include openings 324 and 326, respectively, to receive the first pivot pin 306. The openings 324 and 326 may be aligned with each other. Also, in some examples, the latch enclosure 202 may include one or more openings that are aligned with the openings 324 and 326. Accordingly, the first pivot pin 306 may be passed though the openings 324 and 326 via an opening in the latch enclosure 202 to securely mount the lever 204 in the latch enclosure 202, as shown in FIG. 3 (see FIG. 6). In some examples, the first pivot pin 306 may be a screw having threads. Accordingly, the first pivot pin 306 when inserted into the openings 324 and 326, the threads on the first pivot pin 306 may be screwed into an opening formed on other end of the latch enclosure 202.

In certain examples, the latch enclosure 202 may include an insert (not shown) disposed in the opening that may receive a threaded end of the first pivot pin 306. The insert may be made of hard plastic or metal, such as brass, for example. The insert may have threads formed on an internal surface to engage with the threads on the first pivot pin 306 when the first pivot pin 306 is screwed into the insert. In certain other examples, the opening of the latch enclosure 202 that receives the threaded end of the first pivot pin 306 may have threads formed on an internal surface of the opening to engage with the threads on the first pivot pin 306 when the first pivot pin 306 is screwed into the opening.

Other latches use spring pins which can pass through holes formed in the lever and the housing of the latch to allow pivotal movement of the lever. As it is understood that the spring pins typically applies outward force about an opening receiving the spring pin for a secure fit. Use of the first pivot pin 306 having threads to engage with the latch enclosure 202 may greatly reduce force applied on the latch enclosure 202 thereby avoiding any damage to the plastic based latch enclosure 202, for example. Accordingly, reliability of the latch 104 may be enhanced.

Further, as depicted in FIG. 3, the hook 304 may have an S-shaped structure, for example. The hook 304 may include a first end 328, a second end 330 opposite to the first end 328, and an opening 332 at a location between the first end 328 and the second end 330. Also, in some examples, the ends 328 and 330 may respectively have protrusions 334 and 336 oriented in opposite directions from each other. For example, while the protrusion 334 may be oriented downward the protrusion 336 may be directed upward, as shown in FIG. 3.

The hook 304 may be disposed at least partially within the latch enclosure 202. In particular, that the hook 304 may be mounted to the latch enclosure 202 via the second pivot pin 308. Once mounted, the hook 304 may remain engaged with the lever 204. The hook 304 may be arranged such that the opening 332 may receive the second pivot pin 308. In some examples, the second pivot pin 308 may be secured with the latch enclosure 202 via one or more openings or grooves (not shown) formed in the latch enclosure 202. Such openings or grooves formed in the latch enclosure 202 may be aligned with the opening 332. By way of example, the second pivot pin 308 may be a spring pin (as depicted in FIGS. 3 and 6), a rod, or a bar, that can pass through the opening 332 formed in the hook 304. Such mounting of the hook 304 via the second pivot pin 308 may allow the hook 304 to pivot about the second pivot pin 308. Further, the hook 304 may be mounted such that the second end 330 protrudes outside of the latch enclosure 202 and the first end 328 of the hook 304 may be engaged with the force transfer section 312 of the lever 204. For example, the protrusion 334 (oriented downward) at the first end 328 engages with the force transfer section 312 as shown in FIG. 3.

Furthermore, in some examples, the latch assembly 302 may include a first spring 338. The first spring 338 may be disposed axially around the second pivot pin 308 such that the first spring 338 biases the hook 304 toward the lever 204. In particular, the first spring 338 may apply force on the hook 304 such that first end 328 of the hook 304 applies pressure on the force transfer section 312 of the lever 204. Such pressure applied to the force transfer section 312 retains the lever in a first position as shown in FIG. 3 until the force applied on the force application section 320 of the lever 204 which can overcome the pressure applied to the force transfer section 312. In some examples, in such an arrangement of the lever 204 and the hook 304, a movement of the lever 204 about the first pivot pin 306 may cause a movement of the hook 304 about the second pivot pin 308 via the force transfer section 312.

In some examples, if a computing system, such as the computing system 101 of FIG. 1, having the latch 104 is to be mounted on the receiving structure 303, the computing system may be guided into the receiving structure 303 (e.g., rail) in a direction 305 indicated by an arrow. Once guided in the direction 305, the second end 330 of the hook may encounter a pin 307 disposed on the receiving structure 303.

When a force is applied on the computing system (or the latch 104) in the direction 305, the latch 104 may snap-fit onto the receiving structure 303. In some examples, the protrusion 336 at the second end 330 of the hook may include an angular edge which may cause the second end 330 of the hook 304 to lower when the hook encounters the pin 307. Moreover, due to the bias exerted by the first spring 338, the second end 330 may be lifted-up in a position (as shown in FIG. 3) causing the latch 104 to lock with the receiving structure 303.

In certain instances, the computing system may utilize an additional secure coupling with the receiving structure 303 to avoid any damages or unnecessary lifting of the computing system. In order to aid in such additional secure coupling of the computing system, in some examples, the latch assembly 302 may further include a retaining fixture 340. The retaining fixture 340 may enable additional coupling of the latch 104 with the receiving structure 303. The retaining fixture 340 may include a latch retaining screw 344, a bracket 346 (see FIG. 5, as well), and a second spring 348, for example. The latch retaining screw 344 may include a head 350 and a tail 352. In some examples, the head 350 may have a larger cross-sectional area than the tail 352. The latch retaining screw 344 may be positioned in the latch 104 such that the head 350 of the latch retaining screw 344 is disposed inside the latch enclosure 202 and a tail of the latch retaining screw 344 may protrude outside of the latch enclosure 202. Moreover, the latch retaining screw 344 may include one or more threads near the tail 352 to allow the latch retaining screw 344 to be screwed into a screw receiving post 342 of the receiving structure 303.

Further, in some examples, the latch retaining screw 344 may include a first length portion 354 adjacent to the head 350, and a second length portion 356 adjacent to the first length portion 354. As depicted in FIG. 3, the latch retaining screw 344 may be dimensioned such that a diameter of the first length portion 354 may be greater than the second length portion 356. In the example of FIG. 3, the latch retaining screw 344 is shown to have a step change (e.g., sudden drop) in diameter from the first length portion 354 to the second length portion 356. In certain examples, the diameter change (e.g., decrease) gradually from the first length portion 354 to the second length portion 356.

Further, the bracket 346 may be formed from a sheet or a plate of material. The perspective view 500 of the bracket 346 may be observed by viewing the bracket 346 in a direction 309 indicated by an arrow. In some examples, the bracket 346 may include two side faces 368 and 370 at an angle from each other. In some examples, the angle between the side faces 368 and 370 may be 90 degrees. In some examples, the bracket 346 may be coupled to the latch enclosure 202 via the side face 370. In the example of FIG. 5, the side face 370 may include one or more openings 372 to receive the screws (not shown) to enable coupling of the bracket 346 with the side wall 108 of the system enclosure 102 (see FIG. 1). In some other examples, the bracket 346 may be coupled to the system enclosure 102, via use of adhesives, clamps, pins, or combinations thereof.

In some examples, the bracket 346 (see FIGS. 3 and 5) may be disposed on a side of the latch 104 that may face the receiving structure 303. For example, the side of the latch 104 that may face the receiving structure 303 may be coupled to the side face 368 of the bracket 346. Therefore, a portion of the bracket 346 that is visible in the cross-sectional view 300 of FIG. 3 is a cross-section of the side face 368. The bracket 346 may be coupled to the latch enclosure 202, in some examples, via use of adhesives, one or more screws (e.g., screws 364, 366 shown in FIG. 6), clamps, pins, or combinations thereof. In the examples, the side face 368 of the bracket 346 may include openings 374, 376 to receive the screws 364 and 366, respectively.

Further, the bracket 346 may include one or more openings, such as, one or more of a first opening 358, a second opening 360, and a third opening 362. In some examples, the first opening 358, the second opening 360, and the third opening 362 may be formed on the side face 368 of the bracket 346. The bracket 346 may be aligned such that the first opening 358 may receive the tail 352 of the latch retaining screw 344. Further, in some examples, the first opening 358 may be dimensioned such that a diameter of the first opening 358 is smaller than the diameter of the first length portion 354 of the latch retaining screw 344. Consequently, in some examples, the bracket 346 may restrict forward movement of the latch retaining screw 344 thereby retaining the latch retaining screw 344 within the latch enclosure 202.

Further, the second spring 348 may be disposed in contact with the bracket 346 and the latch retaining screw 344 to bias the head 350 of the latch retaining screw 344 away from the bracket 346. In some examples, the second spring 348 may be retained in place via the second opening 360. In particular, the second opening 360 may receive the second spring 348 such that one end of the second spring 348 remains in contact with the head 350 of the latch retaining screw 344 and another end of the second spring 348 may protrude outside of the bracket 346. In one example, the second opening 360 may be a through hole. In some examples, as shown in FIG. 5, the second opening 360 may be a spiral groove passing through a thickness of the bracket 346 surrounding the first opening 358. The second opening 360 which may allow passage of the second spring 348 there-through.

Other latches use additional retaining housings about screws and springs to retain the screws and springs in place. In accordance with various aspects of the present disclosure, the design of the bracket 346 with the first opening 358 and the latch retaining screw 344, dimensioned as described hereinabove, obviates any additional retaining housings. Further, use of the second opening 360 formed in the bracket 346 retains the second spring 348 in place while biasing the head 350 of the latch retaining screw 344. Any additional retaining housings may be avoided resulting on less-complex and affordable structure of the latch 104.

Moreover, the third opening 362 in the bracket 346 may receive the second end 330 of the hook 304. In particular, the third opening 362 may allow the second end 330 of the hook 304 to protrude outside of the latch enclosure 202 and facilitate engagement of the protrusion 336 with the receiving structure 303. In some examples, the third opening 362 may be dimensioned such that movement of the second end 330 the hook 304 is enabled to couple and/or release the latch 104 from the receiving structure 303.

In some examples, if a computing system, such as the computing system 101 of FIG. 1, having the latch 104 is to be removed from the receiving structure 303 and if the latch retaining screw 344 is engaged with the screw receiving post 342, the latch retaining screw 344 may first disengage from the screw receiving post 342, If the latch retaining screw 344 is not engaged with the screw receiving post 342, the computing system may be removed from the receiving structure 303 by operating the latch 104. In order to uncouple the latch 104 from the receiving structure 303, the lever 204 of the latch 104 may be operated by applying a downward force on the force application section 320 of the lever 204. By applying the downward force on the force application section 320, the lever 204 may pivot about the first pivot pin 306 and the force transfer section 312 may be lifted-up causing the lever 204 to move from the first position shown in FIG. 3 to a second position depicted in FIG. 7.

Figure 7:
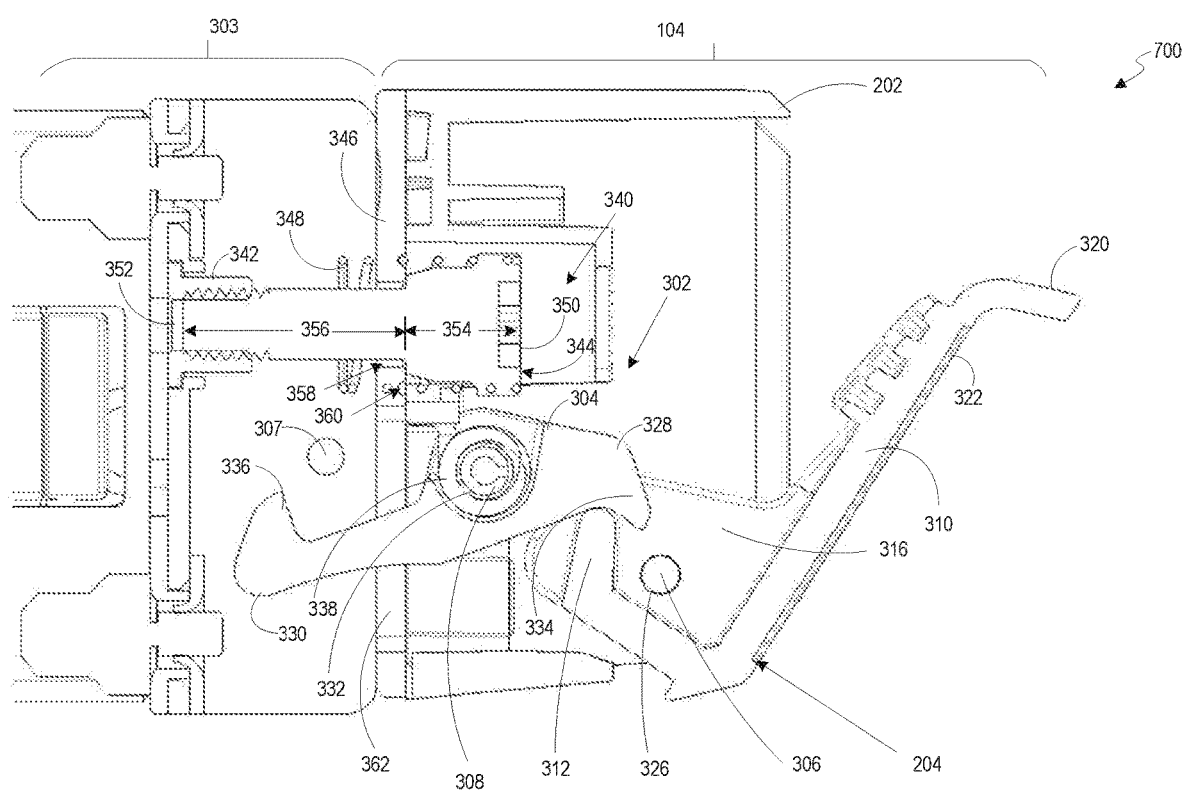
FIG. 7 is a cross-sectional view of a portion of a latch depicting a lever operated in a position to allow removal of a computing system from a receiving structure, in accordance with one example.

Referring now to FIG. 7, a cross-sectional view 700 of the portion 3 of the latch 104 depicting the lever 204 operated in a position (e.g., the second position) to allow removal of a computing system (e.g., the computing system 101) from the receiving structure 303 is depicted, in accordance with one example. As such, FIG. 7 represents components of the latch 104 and the receiving structure 303 which are already described in FIGS. 3-6, however, with the lever 204 operated in a different operating position. The second position of the lever 204, as depicted in FIG. 7, may refer to a position of the lever 204 which is attained by applying the downward force on the force application section 320, as depicted in FIG. 7. When the lever 204 is moved to the second positon as depicted, the force transfer section 312 may apply an upward force on the first end 328 of the hook 304. Such force exerted by the force transfer section 312 on the first end 328 may cause the hook 304 to pivot about the second pivot pin 308 resulting in a downward movement of the second end 330 of the hook 304. The downward movement of the second end 330 of the hook 304 causes the latch 104 to disengage from the pin 307 of the receiving structure 303. Such a position of the hook 304 may allow removal of the computing system from the receiving structure 303.

The latches 104, 106, in accordance with various aspects of the present disclosure, provides a reliable, cost-effective, and less-complex structures in comparison to other latches. For example, the handle section 310, the force transfer section 312, and the side wall sections 314, 316 may be made of plastic or any other light-weight material. Use of the plastic based force transfer section 312 may impart reduced load on the side wall sections 314, 316 in comparison to the spring pin used in levers of other latches. Furthermore, in accordance with aspects of the present disclosure, the side wall sections 314, 316 may be dimensioned to have thickness which can withstand a force exerted on the force transfer section 312, thereby enhancing a reliable operation of the lever 204 and the latch 104. Moreover, use of the first pivot pin 306 having a threaded end to engage with the latch enclosure 202 may greatly reduce force applied on the latch enclosure 202 thereby avoiding any damage to the plastic based latch enclosure 202, for example. Additionally, the designs of the bracket 346 with the first opening 358, the second opening 360, and the latch retaining screw 344 obviates the use of any additional retaining housings resulting in a less-complex and affordable structure of the latch 104.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A latch comprising:
   a latch enclosure; and
   a latch assembly housed at least partially within the latch enclosure, wherein the latch assembly comprises:
   a lever mounted to the latch enclosure via a first pivot pin and comprising a handle section disposed at least partially outside the latch enclosure, a force transfer section integrated with the handle section and disposed inside the latch enclosure, and a force application section disposed outside the latch enclosure to receive a force to cause the lever to move about the first pivot pin;
   a hook mounted at least partially within the latch enclosure via a second pivot pin, wherein the hook comprises a first end engaged with the force transfer section and a second end protruding outside of the latch enclosure to engage with a receiving structure, wherein a movement of the lever about the first pivot pin causes a movement of the hook about the second pivot pin via the force transfer section; and
   a retaining fixture to enable coupling of the latch with the receiving structure, wherein the retaining fixture comprises a latch retaining screw to engage with the receiving structure.

2. The latch of claim 1, wherein the lever further comprises side wall sections between the handle section and the force transfer section, wherein the side wall sections comprise openings to receive the first pivot pin.

3. The latch of claim 1, wherein the hook comprises an opening located between the first end and the second end to receive the second pivot pin.

4. The latch of claim 3, wherein the latch assembly further comprises a first spring to bias the hook such that the first end of the hook applies pressure on the force transfer section of the lever.

5. The latch of claim 3, wherein the latch retaining screw is positioned such that a head of the latch retaining screw is disposed inside the latch enclosure and a tail of the latch retaining screw protrudes outside of the latch enclosure, wherein the tail comprises threads to allow the latch retaining screw to be screwed into a screw receiving post of the receiving structure, and wherein the retaining fixture further comprises:
   a bracket to restrict forward movement of the latch retaining screw; and
   a second spring disposed in contact with the bracket and the latch retaining screw to bias the head of the latch retaining screw away from the bracket.

6. The latch of claim 5, wherein the latch retaining screw further comprises a first length portion adjacent to the head of the latch retaining screw, and a second length portion adjacent to the first length portion, wherein a diameter of the first length portion is greater than that of the second length portion.

7. The latch of claim 6, wherein the bracket comprises a first opening to receive the tail of the latch retaining screw, wherein a diameter of the first opening is smaller than the diameter of the first length portion of the latch retaining screw.

8. The latch of claim 7, wherein the bracket comprises a second opening to receive the second spring such that one end of the second spring remains in contact with the head of the latch retaining screw and another end of the second spring protrudes outside of the bracket.

9. The latch of claim 8, wherein the second opening is a spiral groove surrounding the first opening.

10. The latch of claim 5, wherein the bracket comprises a third opening to receive the second end of the hook.

11. A computing system comprising:
   a system enclosure housing one or more electronic components, wherein the system enclosure comprises a plurality of side walls;
   a latch disposed on at least one side wall of the plurality of side walls, wherein the latch comprises;

a latch enclosure; and a latch assembly housed at least partially within the latch enclosure, wherein the latch assembly comprises:

a lever mounted to the latch enclosure via a first pivot pin and comprising a handle section disposed at least partially outside the latch enclosure and a force transfer section integrated with the handle section and disposed inside the latch enclosure;

a hook mounted at least partially within the latch enclosure via a second pivot pin, wherein the hook comprises a first end engaged with the force transfer section and a second end protruding outside of the latch enclosure for to engage with a receiving structure, wherein a movement of the lever about the first pivot pin causes a movement of the hook about the second pivot pin via the force transfer section; and a retaining fixture to enable coupling of the latch with the receiving structure, wherein the retaining fixture comprises a latch retaining screw to engage with the receiving structure.

12. The computing system of claim 11, wherein the latch engages with the receiving structure.

13. The computing system of claim 11, wherein the latch is mountable on rails, wherein the rails are disposed on a rack.

14. The computing system of claim 11, wherein the lever further comprises side wall sections between the handle section and the force transfer section, wherein the side wall sections comprise openings to receive the first pivot pin.

15. The computing system of claim 11, wherein the hook comprises an opening located between the first end and the second end to receive the second pivot pin.

16. The computing system of claim 15, wherein the latch assembly further comprises a first spring to bias the hook such that the first end of the hook applies pressure on the force transfer section of the lever.

17. The computing system of claim 15, wherein the retaining fixture further comprises:

a bracket to restrict forward movement of the latch retaining screw, wherein the latch retaining screw positioned such that a head of the latch retaining screw is disposed inside the latch enclosure and a tail of the latch retaining screw protrudes outside of the latch enclosure, wherein the tail comprises threads to allow the latch retaining screw to be screwed into a screw receiving post of the receiving structure; and a second spring disposed in contact with the bracket and the latch retaining screw to bias the head of the latch retaining screw away from the bracket.

18. The computing system of claim 17, wherein the latch retaining screw further comprises a first length portion adjacent to the head of the latch retaining screw, and a second length portion adjacent to the first length portion, wherein a diameter of the first length portion is greater than that of the second length portion.

19. The computing system of claim 18, wherein the bracket comprises:

a first opening to receive the tail of the latch retaining screw, wherein a diameter of the first opening is smaller than the diameter of the first length portion of the latch retaining screw;

a second opening to receive the second spring such that one end of the second spring remains in contact with the head of the latch retaining screw and another end of the second spring protrudes outside of the bracket; and a third opening to receive the second end of the hook.

20. The computing system of claim 19, wherein the second opening is a spiral groove surrounding the first opening.

* * * * *